United States Patent [19]

Cassat

[11] Patent Number: 4,541,894

[45] Date of Patent: Sep. 17, 1985

[54] METALLIZABLE, ESSENTIALLY ISOTROPIC POLYMERIC SUBSTRATES WELL ADOPTED FOR PRINTED CIRCUITS

[75] Inventor: Robert Cassat, Ternay, France

[73] Assignee: Rhone-Poulenc SA, Courbevoie, France

[21] Appl. No.: 614,760

[22] Filed: May 29, 1984

[30] Foreign Application Priority Data

May 27, 1983 [FR] France ............................. 83 09027

[51] Int. Cl.[4] .............................................. D21F 11/00
[52] U.S. Cl. ................................... 162/138; 162/124; 162/125; 162/128; 428/290; 428/323; 428/402; 428/901
[58] Field of Search .................... 162/181.9, 146, 138, 162/157.3, 168.2, 168.7, 181.9, 124, 125, 128; 428/901, 283, 290, 329, 474, 323

[56] References Cited

U.S. PATENT DOCUMENTS

| | | | |
|---|---|---|---|
| 4,294,877 | 10/1981 | Graham | 428/290 |
| 4,313,999 | 2/1982 | Hughes | 428/290 |
| 4,456,712 | 6/1984 | Christie et al. | 428/290 |

FOREIGN PATENT DOCUMENTS

0019159  4/1983  Japan .................................. 428/901

*Primary Examiner*—James J. Bell
*Attorney, Agent, or Firm*—Burns, Doane, Swecker & Mathis

[57] ABSTRACT

Essentially isotropic metallizable polymeric substrates having very low coefficients of thermal expansion are well adopted for printed circuits, are facilely prepared by papermaking technique and hot pressing, and are comprised of a fibrous polymer matrix, advantageously an aramide non-woven batt, bonded together with a cured imido prepolymer, and include particulate filler material, advantageously electrically insulating metal oxide particles, distributed therethrough.

19 Claims, No Drawings

4,541,894

METALLIZABLE, ESSENTIALLY ISOTROPIC POLYMERIC SUBSTRATES WELL ADOPTED FOR PRINTED CIRCUITS

BACKGROUND OF THE INVENTION

1. Field of the Invention

The present invention relates to metallizable isotropic substrates comprising a polymeric material, reinforcing fillers and pulverulent fillers, as well as to a process for the preparation of such substrates.

2. Description of the Prior Art

In the electronics field, the trend towards high densities of integration in integrated circuits manifests itself, for example, by the need to have available rigid boxes equipped with a large number of outlets. The chip carriers are a suitable solution to this problem, but their development is restricted both by their high price and by as yet unsolved technical problems. For the moment, these ceramic boxes are often mounted on ceramic substrates and soldered thereto by means of metal contacts.

However, ceramic carriers are expensive, delicate to handle because of their fragile nature, and excessively small. Hence, there arises the problem of providing carriers which have a coefficient of thermal expansion close to that of silicon or of ceramics, which are not sensitive to moisture, which are isotropic and which have good mechanical properties both at low temperatures and at high temperatures which can be as much as 250° C.

Numerous solutions to this problem have been proposed, some of which have already reached the market stage; they employ polymeric materials such as epoxy resins, polyimides or mixtures of epoxy resins and polyimides and reinforcing fabrics made from glass fibers, quartz fibers, boron fibers, carbon fibers or aromatic polyamide fibers. However, these substrates themselves exhibit a certain number of disadvantages. Thus, for example, the polyimide substrates reinforced with glass fibers have too high a coefficient of expansion. The polyimide substrates reinforced with Kevlar ® (aromatic polyamide) fabric are difficult to prepare and do not permit good hole-piercing. Moreover, they are anisotropic.

It is on the other hand known, from French Pat. Nos. 2,256,452 and 2,163,383, that it is possible to produce non-woven articles which consist of webs of fibers which are infusible, or have melting points above 180° C., bonded together by polymers of the polyamide-imide or polyimide type. However, the porous structure of these non-wovens as well as their mechanical properties are entirely different from the substrates according to the invention.

SUMMARY OF THE INVENTION

Accordingly, a major object of the present invention is the provision of improved metallizable substrates well adopted for printed circuits, which substrates, in addition to having low moisture take-up on the order of 0.03 to 0.5%, have coefficients of thermal expansion, between $-65°$ C. and 125° C., which vary from 3 to $8 \times 10^{-6}$ cm/cm/°C. and which are very isotropic.

Another object of the invention is to provide, from metallizable substrates, carriers which are metallized in accordance with a predetermined pattern and can be used as carriers for printed circuits or can replace the ceramic carriers referred to above.

Briefly, the isotropic metallizable substrates according to the invention are characterized in that they comprise polymeric fibers bonded together by a polymer comprising imide groups, and of fillers, and are shaped wet, dried and then pressed hot.

DETAILED DESCRIPTION OF INVENTION

More particularly according to the present invention, by "metallizable substrates" there are intended substrates which, because of their composition or their structure, can include or are adopted to receive a metal layer on at least one face surface thereof. These substrates can be rigid or semi-rigid depending upon the composition of the insulating carrier material. By "semi-rigid" substrate there is intended a material which can undergo resilient deformation when bent.

Metallization can be carried out either by providing a film of metal which is glued or otherwise adhered onto the surface of the substrate, or by depositing a layer containing a substance which can be converted to free metal by a subsequent chemical treatment, or which serves as a primer for electrolytic or chemical deposition of metal. This metallization can also be carried out by direct chemical treatment of the substrate, which in that case contains, within the body of its material, a compound capable of being converted to metal.

By "isotropic" substrates there are intended substrates which are isotropic in a plane in which the physical properties do not depend upon the direction in which the measurements are carried out and are essentially identical in all directions.

These substrates are obtained by, in a first stage, producing a non-woven by a wet method from small fibers of polymeric materials having good heat stability, a binder and fillers.

The fibers which can be used according to the invention are fibers whose mechanical properties are maintained above 200° C. and which exhibit a low or even negative coefficient of thermal expansion.

Such fibers are advantageously selected from among the aramides, which are marketed under the trademarks NOMEX or KEVLAR or KERMEL or, in cases where the heat resistance properties required are a little less stringent, from among polyethylene glycol terephthalate fibers. However, the aramides, such as those described in French Pat. No. 2,079,785 and more especially those described in French Pat. No. 1,526,245, are preferred. These fibers are usually in the form of short fibers, whose lengths do not exceed 25 mm.

These fibers can be combined with a minor proportion of inorganic fibers such as glass fibers, carbon fibers, aluminum oxide and zirconium oxide fibers, asbestos fibers or boron fibers and, quite generally, whiskers which already find use in other applications.

The fiber content in the total composition ranges from 20% to 60% by weight.

As a binder, advantageously used are prepolymers comprising imide functions, which in the hardened state are highly cross-linked and which, because of this fact, have very high moduli and very low degrees of thermal expansion. Thus, it is possible to use polyimides or polyamide-imides or even, where appropriate, polyetherimides. Preferably, the polyimide used is a prepolymer obtained from an N,N'-bis-imide of an unsaturated dicarboxylic acid, of the general formula:

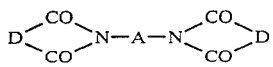  (1)

in which D represents a divalent radical containing a carbon-carbon double bond and A is a divalent organic radical possessing 2 to 30 carbon atoms, and a polyamine of the general formula:

R(NH$_2$)$_x$  (2)

in which x is an integer at least equal to 2 and R represents an organic radical of valency x, the amount of bis-imide ranging from 0.55 to 25 moles per mole of —NH$_2$ groups provided by the polyamine.

Such polyimides are in particular described in French Pat. No. 1,555,564 but numerous derivatives of these polymers can also be used. Thus, the polyimide resin can also be obtained by reaction between the bis-imide, the polyamine and various adjuvants such as, for example, monoimides (according to French Pat. No. 2,046,498), monomers other than imides and containing one or more polymerizable groups of the CH$_2$C= type (according to French Pat. No. 2,094,607), unsaturated polyesters (according to French Pat. No. 2,102,878), or hydroxylic organosilicon compounds (according to French Pat. No. 2,422,696). In the case where such adjuvants are used, it must be remembered that the polyimide resin can be obtained either by heating the three reactants (bis-imide, polyamine and adjuvants) directly together, or by heating the reaction product, or the mixture, of the adjuvant with a previously prepared prepolymer of bis-imide and polyamine.

In any event, prepolymers which can exist in powder form are selected. More preferably, there is used in the present invention a polyimide resin produced by the reaction between a bis-maleimide, such as N,N'-4,4'-diphenylmethane-bis-maleimide and a primary diamine such as 4,4'-diamino-diphenylmethane and, optionally, one of the various adjuvants mentioned above.

The polyamide-imide prepolymers used as binders according to the invention can be defined as containing a plurality of recurring units of the formula:

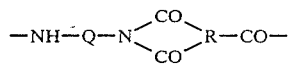  (I)

in which the symbol Q represents a divalent radical containing at least one benzene ring and the symbol R represents a trivalent aromatic radical.

Exemplary of the radicals represented by Q, representative are the m-phenylene, phenylene, p,p'-diphenylene radicals or the radicals of the formula:

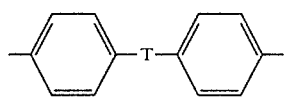  (II)

in which the symbol T represents a bridging divalent atom or group such as —O—, —CH$_2$—, —C(CH$_3$)$_2$—, —SO$_2$— or —N=N—.

Exemplary of the radicals represented by the symbol R, illustrative are the trivalent radicals of the formulae:

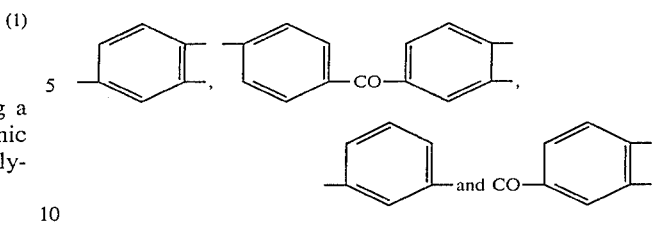

The polyamide-imides described above can be prepared in accordance with various techniques, such as those described in British Pat. Nos. 570,878 and 1,281,446, U.S. Pat. No. 3,260,691, and French Pat. Nos. 1,386,617, 1,473,600, 1,501,198, 1,559,357 and 1,576,844.

Among these polyamide-imides, particularly advantageous are those obtained from trimellitic anhydride and a difunctional derivative of the formula:

X—Q—X  (III)

in which the symbol X represents an NCO group or a group of the formula —NHCOR$_1$, with the symbol R$_1$ representing an alkyl radical having from 1 to 6 carbon atoms or a phenyl or methylphenyl radical.

Preferably, polyamide-imides which permit the polymer to be processed in the form of a powder are used in the invention. The polytrimellitamide-imides produced by the reaction of tri-mellitic anhydride with 4,4'-diisocyanato-diphenylmethane or 4,4'-diisocyanato-diphenyl ether are well suited for the manufacture of substrates according to the invention.

These resins can be used in admixture with an amount, which can vary from 0 to 75% by weight, of other thermosetting resins, for example, epoxy resins such as the reaction products of epichlorohydrin with bis-phenol A. The resin content advantageously ranges from 20 to 70% by weight of the total composition.

The filler used is desirably a metal oxide which is electrically non-conductive. This oxide must be in the form of particles of very small size. A preferred particle size ranges from 0.1 to 5 microns. Among the metal oxides which can be used, representative are nickel-II oxide, cobalt-II oxide, lead-II oxide, cadmium-II oxide, chromium-III oxide, antimony-III oxide, tin-IV oxide and copper-I oxide. However, the latter oxide is the preferred. To this metal oxide may be added a certain amount of an inert filler. Fillers having a low coefficient of expansion are selected. Such fillers can be pulverulent or in the form of particles, such as mica flakes.

The total filler content advantageously ranges from 10 to 60% by weight of the total composition.

The fillers preferably comprise 10 to 50% by weight of metal oxide and 0 to 40% by weight of an inert filler.

The composition consisting of fibers, binder and fillers is processed by the wet method, also referred to as the papermaking method. This method includes directly suspending all the constituents in water, in a mixer referred to as a beater in the papermaking art. The fibers of small size, the binder in the form of a powder as well as the pulverulent or flake-like fillers thus form a stock which is shaped on a machine of papermaking type and comprising a chest from which the stock flows onto a porous travelling belt which allows a first removal of water. A draining system, if appropriate under slight pressure, followed by application of a vacuum and then by drying at a temperature on the order of 70° to 110° C.

makes it possible to obtain a type of cardboard in which the binder is still in the prepolymer state. Its density typically ranges from 0.3 to 2.

This type of cardboard is then cut to shape and thereafter hot pressed. Usually, a platen press operating at 10 to 300 bars and a temperature of above 70° C. is used. It is possible to employ cycles during which the pressure and temperature are increased in stages. This depends essentially on the nature of the binder selected.

In the case of the preferred polyimide prepolymers obtained from a bis-imide, a polyamine and, optionally, one of the above-mentioned adjuvants (in general having a softening point ranging from 50° to 200° C.), the pressing temperature typically ranges from 70° to 280° C. Preferably, the temperature is above 150° C. in order to permit effective bonding (or mechanical combination) of the various constituents.

These pressing temperature conditions also apply to the other types of thermosetting prepolymers which fall within the scope of the present invention. In general, heating the prepolymers makes it possible to cause them to successively soften and then harden. Of course, the entire composite can be baked, for example, for several hours at 200° C. or above.

The aforedescribed technique for manufacture of the metallizable substrates according to the invention possesses numerous advantages.

As has already been mentioned, this manufacturing process is simpler because a limited number of constituents is used, and makes it possible to dispense with the process of impregnating the reinforcing structure with a collodion, which pollutes the environment.

However, there are also other advantages. The preparation of the cardboard by a papermaking method is a high-yield process. Moreover, the papermaking method permits recycling of scrap: there is no disadvantage in reintroducing into the beater the cardboard scrap produced before pressing. Moreover, it is found that there is virtually no flow of polyimide during the final hot pressing. The end effect of this ability to recycle, coupled with virtually zero flow during pressing, ensures that there is a very low loss of resin during manufacture.

The hot-pressed and optionally baked blanks can subsequently be subjected to a metallizing treatment. It can be necessary to first strip and expose the metal oxide particles at the face surfaces thereof by mechanical treatment such as sand-blasting, use of grinding wheels, rubbing with an abrasive and/or chemical treatment.

It has been found that the conversion of the metal oxide to metal, and especially of cuprous oxide to metallic copper, can be carried out easily and quantitatively by treatment with borohydrides. The conversion is represented by the equation:

$$4Cu_2O + BH_4^- \rightarrow 8Cu + B(OH)_3 + OH^{31}$$

This ease of reaction is probably due to the catalytic effect of the copper metal, which may be explained by the intermediate formation of unstable copper hydride.

The borohydrides which can be used in the present invention include both substituted and unsubstituted borohydrides. Substituted borohydrides in which at most three hydrogen atoms of the borohydride ion have been replaced by inert substituents such as, for example, alkyl radicals, aryl radicals and alkoxy radicals can be used. Preferably, alkali metal borohydrides in which the alkali metal is sodium or potassium are employed. Typical examples of suitable compounds are sodium borohydride, potassium borohydride, sodium diethyl-borohydride, sodium trimethoxy-borohydride and potassium triphenyl-borohydride.

The reduction treatment is carried out in a simple manner by bringing the blank into contact with a borohydride solution in water or in a mixture of water and an inert polar solvent such as, for example, a lower aliphatic alcohol. Purely aqueous borohydride solutions are preferred. The concentration of these solutions can vary over wide limits and preferably ranges from 0.05 to 1% by weight of active hydrogen of the borohydride, the percentage being relative to the solution. The reducing treatment can be carried out at an elevated temperature, but it is preferred to perform it at a temperature close to ambient temperature, for example, from 15° C. to 30° C. As regards the progress of the reaction, it should be noted that it gives rise to $B(OH)_3$ and to $OH^-$ ions, which have the effect of causing an increase in the pH of the medium during the reaction. However, at high pH values, for example above 13, the reduction is slowed such that it can be advantageous to carry out the operation in a buffered medium in order to provide a well-defined rate of reduction. After the reduction, the blank is rinsed.

At the start of the reduction, the reaction essentially affects the cuprous oxide particles which are at the surface of the substrate and which are in direct contact with the reducing agent. Because of the catalytic effect of the copper metal, the reduction reaction thereafter proceeds into the volume of the blank and does so even though the resins used do not possess a particularly pronounced hydrophilic character. Hence, the degree of reduction effected can easily be controlled by principally varying the duration of the treatment. To obtain a resistivity corresponding to the desired values, the duration of treatment needed is in general rather short and usually ranges from about one minute to about fifteen minutes, depending upon the proportions of oxide in the substrate. For a given duration of treatment it is moreover possible to vary the rate of reduction by adding various accelerators to the medium, for example, boric acid, oxalic acid, citric acid, tartaric acid or metal chlorides, such as cobalt-II chloride, nickel-II chloride, iron-II chloride, manganese-II chloride and copper-II chloride.

The reduction which is carried out over the length of time indicated above effects only a portion of the depth of the blank. It should be noted that for electrical applications it is necessary to ensure that only a part of the depth of the blank is reduced, such as to retain an inner non-reduced insulating portion in order to avoid any stray conductive bridging phenomena. On the other hand, if the cut piece has had holes drilled or punched therethrough, it is found that a layer of at least the same thickness as at the surface is also reduced about the peripheral wall of the holes.

Given the finely divided state of the copper obtained after the reducing treatment it would have been expected that it would oxidize very rapidly in air. However, it had been found that this does not happen and that the level of surface resistivity of the blank after reduction does not vary even after several days' storage exposed to the atmosphere.

It is thus possible to store the reduced substrate in this state. By way of precaution, it is possible either to rinse the blank incompletely, leaving traces of reducing agent on its surface, or to add to the rinsing bath a particular reducing agent, for example, hydroquinone, or to protect the rinsed and dried blank by coating it with a protective film, for example, with a photoresist.

The reduced substrate can then be metallized by deposition of a layer of copper, nickel or some other metal. This metallization can be carried out electrochemically, but it too has been found, and this one of the essential advantages associated with carrying out the present invention, that it can also be carried out directly by electrolysis. In certain applications, it is not unusual to seek to deposit a metal layer at least 20 microns thick, and thus the possibility of being able to use electrolysis directly indeed constitutes an industrially economical process. It is of course possible, in the conventional manner, to first carry out an electrochemical metallization and then to thicken this first deposit with a subsequent electrolytic deposit. For a detailed description of the working conditions appropriate to electrochemical metallization, reference is made to *Encyclopedia of Polymer Science and Technology,* 8, pages 658 to 661 (1968). The proportions of the constituents of the electrochemical bath, the duration of immersion of the blank, the temperature and the other working conditions are in each particular case determined in a manner known per se in order to obtain the best results.

Metallization by electrolysis is well known. Cf. in particular *Encyclopedia of Polymer Science and Technology,* 8, pages 661 to 663 (1968). The suitably reduced blank constitutes the cathode and the metal to be deposited constitutes the anode. Both are immersed in an electrolyte through which a current is passed. For example, in the case of electrolytic coppering, the metal deposited can be formed from monovalent or bivalent copper and can originate from a cyanide-containing electrolyte (monovalent copper) or from an electrolyte based on a sulfate, pyrophosphate or fluoborate (divalent copper). A number of adjuvants can be introduced into the electrolyte, such as an alkali metal or alkaline earth metal salt, an acid (acidic copper sulfate coppering bath) or a base (alkaline stannate tinning bath), to increase the conductivity of the electrolyte; a buffer to avoid rapid pH variations; or substances which alter the structure of the electrocoatings, such as, for example, colloids, surfactants, a phenol, a sulfonated phenol, an inorganic or organic brightener, or a levelling agent such as coumarin. The quality of the electrocoating, whether it be of a metal or of a metal alloy, will depend upon the composition of the electrolyte and on the physical conditions of the electrolysis (temperature, cathodic and anodic current density, anode-cathode distance, surface conditioning of the electrodes, etc.); in each particular case, these various parameters are regulated in a manner known per se.

The fact that the reduction can be made to propagate into the volume of the substrate makes it possible to achieve the following advantages: during metallization, there is deep anchoring of the metal deposited in the resin substrate; in the case of soldering with addition of metal, forming an alloy, the alloy can also migrate into the substrate because there is real continuity of copper in the depth of the substrate; in the case of metallization intended to act as a heat sink, it is possible to vary the thermal conductivity of the resin by causing the reduction to progress to a greater or lesser degree into the body of the blank.

Of course modifications can be made to the embodiments which have just been described, especially by substitution of equivalent means, for example, in respect of the metal oxide used, without thereby going outside the scope of the present invention. Thus the cuprous oxide can be replaced by other oxides of base metals, the degree of oxidation of which is selected such as to permit easy reduction of the oxide with the borohydride, the metals concerned being capable of transiently forming unstable metal hydrides.

Depending upon the duration of the electrolytic treatment, it is possible to obtain metal layers whose thickness is on the order of one micron, these layers being rooted or anchored into the substrate and exhibiting good cohesion, contrary to the case of "electroless" coatings. Substrates possessing such a thin metal layer are of great interest for the production of printed circuits because they make it possible to eliminate faults, and especially sub-penetration, during subsequent etching treatments. Thus, the density of the circuit arrangement can be increased and the reliability of the circuits improved.

Of course, it is also possible to obtain metal coatings which are much thicker, for example, on the order of 20 to 50 microns, such coatings corresponding to the techniques currently used for the production of printed circuits. It is also possible to deposit layers of an alloy of the lead/tin type by a melting process or electrolytically.

The production of printed circuits from reduced substrates can then be carried out in accordance with the conventional addition processes and the production of circuits from substrates which have been reduced and electrolytically metallized can be carried out by conventional etching.

The process according to the invention also makes it possible to obtain metallizable or metallized substrates which possess a layer of metal, anchored in the polymer, which can be as thin as one micron while still being coherent and strong. This process differs from the prior art processes in its simplicity, its low cost and the large number of possibilities which are open.

Moreover, its technology is suitable for existing equipment. The possible number of variants is very great, because at each stage of the process it is possible to interrupt the sequence, for example, by storing the semi-finished product in order to resume the process later. In order to further illustrate the present invention and the advantages thereof, the following specific examples are given, it being understood that same are intended only as illustrative and nowise limitative.

EXAMPLE 1

Into a 5,000 liter tank, referred to as a beater in the papermaking industry, there were successively introduced 2,000 liters of water and 25 kg of Kevlar ® pulp.

When the stock appeared very homogenous, 30 kg of a polyamide resin marketed under the trademark Kerimid 601 by Rhone-Poulenc, in the form of a powder of particle size less than 60 microns, were gradually introduced, under constant stirring.

Stirring was continued for about 10 minutes and finally 40 kg of $Cu_2O$, of mean particle size 1 micron, were introduced.

The stock suspension gradually turned red as the particles of $Cu_2O$ became attached onto the KEVLAR pulp. An additional 1,000 liters of water were introduced. Finally, 3 kg of a cationic starch in aqueous solution, and 4 liters of a colloidal silica solution were incorporated. After incorporation of the colloidal silica, stirring was restricted to the absolute minimum sufficient to ensure its distribution in the mixture, so as not to interfere with the precipitation which allowed the pulverulent fillers to become fixed to the fibrous reinforcement.

This stock was transferred into a chest which fed the papermaking machine.

The useful width of the filter belt was 2.60 m and its length was 10 meters. The belt consisted of a strong nylon fabric forming an endless belt, which travelled at an (adjustable) speed of 2 meters/minute and was subjected to a transverse vibratory movement.

In the first quarter of its path along the belt the fabric rested on a continuous plane, virtually preventing drainage of water. In this zone, the stock became distributed in a homogenous manner by virtue of the vibrations.

Along the next two quarters the fabric was unsupported and drainage of water occurred naturally.

In the last quarter the fabric passed over suction boxes, ensuring forced drainage.

The final return drum of the fabric was also under vacuum over a portion of its circumference. The deposit of stock was moreover subjected to continuous pressing by a rotating drum which rests on the preceding drum along a generatrix.

When the drained stock, in the form of a continuous sheet 4 mm thick and 2.60 m wide, left the part of the drum which conveyed same to the drying oven, which was 20 m long and permitted complete removal of the water under powerful ventilation and at a low temperature (in the present case 70° C.).

On leaving the oven, the cardboard, weighing 1500 g/m$^2$, was cut into blanks of size 1000×1000 mm, with a thickness of about 3.5 mm. This semi-finished product, in which the resin was still in the form of a prepolymer, was then pressed for 1 hour at 220° C. under 200 bars of pressure. The resulting sheet had brick red color and a thickness of 1.2 mm. Other lamination tests carried out on stacks of "cardboard" under conditions of temperature, pressure and duration identical to those mentioned above, provided laminates of up to 10 mm thickness without the constituent plies showing tendency to delaminate.

Measurement of the coefficient of expansion was carried out on a sample of size 4×6×10 mm (the 10 mm dimension being in the plane of the laminate) at from ambient temperature to 250° C., along the 10 mm dimension, on a DU PONT type 900 thermochemical analysis apparatus.

The coefficient thus determined was $12 \times 10^{-6}$ cm/cm/°C. A 1 mm thick laminate was surface-stripped by means of fine sandpaper and then carefully freed from dust by rinsing with water in an ultrasonic tank. The surface stripping was carried out in such a manner that the glossy film (surface film of pure resin) was removed completely. After this operation, the cuprous oxide filler was accessible or exposed at the surface of the substrate and capable of undergoing the chemical reduction operation which provided the substrate with good surface conductivity.

The reducing solution was prepared as follows:

The following materials were successively introduced under stirring, after dilution of each constituent, into a 1000 ml Erlenmeyer flask:
(i) 500 ml of distilled water,
(ii) 2.5 g of sodium hydroxide pellets,
(iii) 5 g of the sodium salt of a carboxymethylcellulose (type 7ME, medium viscosity, moledular weight 250,000, from HERCULES),
(iv) 25 g of potassium borohydride, and
(v) 5 cm$^3$ of a 1% strength aqueous solution of Cemulsol DB 311 from SFOS.

The substrate was coated with the reducing solution and after 3 minutes' contact the solution and the reaction byproducts were removed by washing with distilled water, accompanied by gentle brushing. The substrate was rinsed with alcohol and dried. The electrical resistance measured between two points on the surface separated by about 20 cm, using point electrodes varied from 10 to 70 ohms.

The surface can be provided with a thickening metal coating by an electrolytic method.

EXAMPLE 2

Using the equipment described in Example 1, the following were successively introduced into the beater:
(i) 3000 liters of water and
(ii) 20 kg of Kevlar pulp.

After homogenization of the stock, there were introduced:

100 kg of a polyimide compound (Kerimid 601 from Rhone-Poulenc) and cuprous oxide in the ratio of 40/60 parts by weight (this compound, obtained by melting a powder mixture of K601 and Cu$_2$O in an oven, having subsequently been finely ground and being free of particles larger than 40 microns).

After a fresh homogenization stage with vigorous stirring, upon completion of which it appeared that the greater part of the compound had been fixed onto the pulp, 80 kg of inert filler were introduced.

For this, a 16 mesh Moscovite mica was used which had been subjected to a dry surface treatment with a coupling agent (vinyl triethoxysilane, reference A 151 from Union Carbide, used in an amount of 1%). A side effect of the dry treatment was to reduce the mean particle size of the mica flakes employed.

After homogenization, an additional amount of about 1000 liters of water was added to adjust the consistency of the stock, followed by 6 kg of cationic starch in aqueous solution and finally by 8 liters of colloidal silica in aqueous solution.

After this last incorporation, stirring was reduced to the strict minimum which gave good distribution throughout the mixture. The liquid at that stage appeared clear, with the fine particles having become fixed to the Kevlar pulp because of the precipitation of the colloidal silica/cationic starch system. The contents of the beater were transferred into the chest from where they constituted the feed to the papermaking machine described in the first example.

The speed of travel of the fabric was about 2 m/min and the resulting "cardboard" had a thickness of 6 mm as it entered the drying oven. On leaving the oven, set to 80° C. the thickness of the cardboard was still 6 mm and its weight was 2200 g/m$^2$. The continuous "cardboard" was cut into blanks of 1000×1000 mm.

These perfectly dry blanks, wherein the resin had remained in the form of a prepolymer, were hot pressed under 150 bars in accordance with the following heating cycle:

Feed into a hot press at 160° C.

Increase the setting to 200° C. after charging (temperature reached after 20 minutes).

Total duration of cycle 1 hour. Discharge hot. Then bake for 12 hours at 250° C. The pressed sheet resulting from the operation had a brick red color and a thickness of about 1.6 mm.

As in Example 1, the coefficient of expansion was determined on the DU PONT T.M.A. apparatus along a direction in the plane of the laminate. The samples used for measurement were cut in such a manner that the axes of measurement form angles of 0, 45 and 90° with an arbitrary direction selected on the lamination plane.

The coefficients of expansion between ambient temperature and 250° C. were comparable for all samples and ranged from 5 to $6 \times 10^{-6}$ cm/cm/°C. A piece of laminate of size $20 \times 20$ cm was surface stripped by sandblasting and then pierced in accordance with a predetermined scheme.

The blank thus pierced was treated with the reducing solution described in Example 1. For this purpose, the blank was placed on the surface of the solution and immersed such that the liquid penetrated into the holes, expelling the air, and then covered the upper face. The plate was then withdrawn and placed vertically to drain.

After 3 minutes' contact, the reducing solution was rinsed off with distilled water, under gentle brushing. The blank was then rinsed with alcohol and dried. Its surface was found to be coppered and electrically conductive, as were the walls of the holes.

The perforated plate thus obtained was then subjected to the operations which permitted the production of a double-face printed circuit with metallized holes, namely:

(1) Deposition of photoresist on front and back.

(2) Irradiation on front and back through a mask.

(3) Development of the photoresist.

(4) Electrolytic thickening in an acidic copper sulfate bath, using a copper anode, in the zones without photoresist as well as in the holes. When the thickness of the coating had reached some thirty microns (in less than one hour) the circuit was rinsed with water.

(5) Stripping of the remaining photoresist.

(6) Non-selective etching with ferric chloride until the copper had completely disappeared in the non-reinforced zones.

(7) Rinsing with water followed by rapid immersion in a dilute sulfuric acid bath to restore a glossy appearance to the circuit.

(8) Careful rinsing with distilled water followed by alcohol, and final drying.

Upon completion of this operation there was obtained a double-face circuit with metallized through-holes, the coefficient of expansion of the circuit substrate being compatible with that of active silicon components. It was thus possible to implant these components directly (for example, by cementing with a conductive cement), thereby providing a hybrid circuit with conductive through-holes.

EXAMPLE 3

A papermaking stock was prepared as indicated in Example 1. Its composition was similar to that of Example 1, namely:

(i) 25 kg of Kevlar pulp,
(ii) 30 kg of K601 polyimide resin (particle size less than 60 microns),
(iii) 40 kg of $Cu_2O$ (particles size less than 1 micron)
(iv) 3 kg of cationic starch,
(v) 4 liters of colloidal silica solution.

The papermaking machine was modified such that at the end of the draining belt the web was taken up on a drum of 2 m diameter. In this case, the technique consisted of collecting on this drum several turns of a web of low weight per unit area such as to increase the thickness of the original web. After this increase, the deposit on the drum was sliced along a generatrix and transferred onto the conveyor belt which led to the oven. For a given setting of the continuously formed web, it was possible to count the number of successive turns taken up on the drum or to follow the thickening of the deposit on the drum by means of a sensor which signalled when the required thickness had been reached.

In the continuous web formation area, the machine was adjusted to form a web of about 200 g/m². This web, taken up on the drum, was cut every 7 turns, when the sensor indicated a thickness of 4 mm. The blank of size 2 m $\times$ 2.60 m was dried at 70° C. and then cut into blanks of size 1 m $\times$ 1.20 m (the trim was recovered and recycled to a subsequent operation).

After lamination as indicated in Example 1, and cutting of samples of size $4 \times 6 \times 10$ mm, the coefficient of expansion was determined, along the 10 mm dimension taken in the plane of the laminate, from ambient temperature to 250° X, on the TMA DU PONT 900 apparatus.

This coefficient was $5 \times 10^{-6}$ cm/cm/°C. regardless of the direction of measurement in the plane of lamination.

EXAMPLE 4

The experiment described in Example 3 was repeated, but replacing the Kevlar pulp by chopped Kevlar fibers of average length 25 mm. After introduction into the beater, the chopped fibers diluted with 2000 liters of water were worked on a papermaking refiner for one hour. After this treatment, the stock obtained was examined under the microscope. It was found that the fibers, which were originally perfectly cylindrical, now had burrs which can improve the anchoring of the fibers to one another and the retention of pulverulent fillers.

The subsequent operations were identical to those noted in Example 3. The resulting product had a coefficient of expansion of $2.5 \times 3 \times 10^{-6}$ cm/cm/°C. regardless of the direction of measurement in the plane of lamination.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. An essentially isotropic metallizable polymeric substrate, comprising a fibrous organic polymer matrix bonded together with a cured imido prepolymer and including particulate filler material distributed therethrough, said substrate having low moisture absorption ranging from 0.03 to 0.5% and a coefficient of thermal expansion, at a temperature ranging from $-65°$ C. to 125° C., which ranges from 3 to $8 \times 10^{-6}$ cm/cm/°C.

2. The metallizable substrate as defined by claim 1, said polymer matrix comprising an aramide non-woven batt.

3. The metallizable substrate as defined by claim 1, said binder comprising a polyimide prepolymer reaction product of an unsaturated dicarboxylic acid N,N'-bisimide with a primary polyamine.

4. The metallizable substrate as defined by claim 1, said binder comprising a polyimide prepolymer reaction product of an unsaturated dicarboxylic acid N,N'-bis-imide with a primary polyamine and an adjuvant comonomer which comprises a monoimide, an ethylenically unsaturated comonomer copolymerizable therewith, an unsaturated polyester or an hydroxylated organosilicon compound.

5. The metallizable substrate as defined by claim 1, said filler material comprising electrically insulating metal oxide particles.

6. The metallizable substrate as defined by claim 5, said metal oxide particles having particle sizes ranging from 0.1 to 5 microns.

7. The metallizable substrate as defined by claim 5, said metal oxide particles comprising cuprous oxide.

8. The metallizable substrate as defined by claim 1, said polymer matrix comprising fibers up to about 25 mm in length.

9. The metallizable substrate as defined by claim 1, comprising from 20 to 60% by weight of fibrous polymer matrix, from 20 to 70% by weight of binder polymer, and from 10 to 60% by weight of filler.

10. The metallizable substrate as defined by claim 1, said polymer matrix further comprising a minor amount of inorganic fibers.

11. The metallizable substrate as defined by claim 5, said filler material comprising up to 40% by weight thereof, of an inert filler.

12. The metallizable substrate as defined by claim 1, further comprising a metallic overlayer on at least one of the face surfaces thereof.

13. The metallizable substrate as defined by claim 1, further comprising a metallic circuit pattern on at least one of the face surfaces thereof.

14. The metallizable substrate as defined by claim 5, said metal oxide particles being exposed on at least one of the face surfaces thereof.

15. The metallizable substrate as defined by claim 14, said metal oxide particles having been reduced to free metallic state.

16. The metallizable substrate as defined by claim 15, further comprising an electrolytically deposited metallic overlayer on at least one of the face surfaces thereof.

17. A process for the preparation of the metallizable substrate as defined by claim 1, comprising formulating a papermaking slurry of said matrix fibers, an imido prepolymer and said filler, depositing a coherent web therefrom, drying said web, and thence hot pressing, to compact and cure same, at a temperature ranging from 70° C. to 250° C. under a pressure of from 10 to 300 bars.

18. The process as defined by claim 17, said imido prepolymer being formulated in powder form.

19. The product of the process as defined by claim 17.

* * * * *